United States Patent [19]

Borkowski et al.

[11] Patent Number: 4,649,416
[45] Date of Patent: Mar. 10, 1987

[54] MICROWAVE TRANSISTOR PACKAGE

[75] Inventors: Michael T. Borkowski, Framingham; David G. Laighton, Boxboro; Barry Altschul, Framingham, all of Mass.

[73] Assignee: Raytheon Company, Lexington, Mass.

[21] Appl. No.: 567,829

[22] Filed: Jan. 3, 1984

[51] Int. Cl.⁴ .................. H01L 23/02; H02G 13/08
[52] U.S. Cl. ........................... 357/74; 357/75; 357/80; 357/81; 174/52 FP
[58] Field of Search ............ 357/74, 75, 80, 81; 174/52 FP; 361/386, 387, 388

[56] References Cited

U.S. PATENT DOCUMENTS

| | | | |
|---|---|---|---|
| 3,683,241 | 8/1972 | Duncan | 357/74 |
| 3,728,589 | 4/1973 | Caulton | 317/234 R |
| 3,753,056 | 8/1973 | Cooke | 317/234 R |
| 3,784,884 | 1/1974 | Zoroglu | 317/234 R |
| 3,936,864 | 2/1976 | Benjamin | |
| 3,946,428 | 3/1976 | Anazawa et al. | 357/74 |
| 3,996,603 | 12/1976 | Smith | 357/80 |
| 4,023,198 | 5/1977 | Malone et al. | 357/81 |
| 4,092,664 | 5/1978 | Davis, Jr. | 357/80 |
| 4,150,393 | 4/1979 | Wilson et al. | 357/81 |
| 4,172,261 | 10/1979 | Tsuzuki et al. | 357/74 |
| 4,213,141 | 7/1980 | Colussi | 357/74 |

Primary Examiner—William L. Sikes
Assistant Examiner—Frank González
Attorney, Agent, or Firm—Richard M. Sharkansky; Denis G. Maloney; Peter J. Devlin

[57] ABSTRACT

A microwave transistor package is provided having a thermal and electrical conductive refractory type substrate. A ground plane plate is provided, such plate having an open-ended compartment therein, the open end of such compartment being disposed adjacent an upper surface portion of the ground plane plate. A bottom surface of such plate is disposed on an upper, inner surface region of the substrate. The thermal coefficient of expansion of the ground plane plate is substantially greater than the thermal coefficient of expansion of the substrate. An electrical insulator is disposed within the compartment, such insulator having a relatively high thermal transfer characteristic and having upper and lower conductive layers with side wall portions disposed adjacent side wall portions of the compartment. A first apertured ceramic insulating layer having conductive metallization regions disposed on the upper surface of the ceramic insulator extending from the apertured edge of the ceramic insulator to the outer edge of the ceramic insulator is provided. The lower surface of the ceramic insulator is disposed over the substrate and about peripheral portions of the inner surface region of the substrate. A second apertured ceramic insulating layer is disposed over and aligned with the first apertured ceramic insulating layer, the upper surface of the second ceramic insulating layer being metallized and bondable to a cover for such package. The package is fabricated by brazing together, in a single step, the pair of ceramic insulating layers, the electrical insulator and the substrate.

5 Claims, 5 Drawing Figures

MICROWAVE TRANSISTOR PACKAGE

BACKGROUND OF THE INVENTION

This invention relates generally to microwave transistor packages and method of manufacturing such packages and more particularly microwave transistor packages having low parasitic reactance and adapted to have packaged therein impedance matching circuitry for the packaged transistor.

As is known in the art, in order to provide transistor components having relatively high power, high efficiency and high gain, in many applications it is necessary to connect in parallel a large number of individual transistor cells within a hermetically sealed package. Increasing the number of cells in parallel, however, reduces the input impedance of the transistor component. For example, a typical unmatched 30 watt bi-polar transistor component having parallel connected cells at L-band has an input impedance of about 0.3 ohms, while the input impedance of a typical 100 watt component is typically less than 0.1 ohms. This relatively low impedance is clearly very difficult to impedance match to, and reproducibility suffers as the impedance to be matched becomes sensitive to component variations and manufacturing or assembly tolerances. Thus, it becomes highly desirable to provide an impedance matching network within the package, since if the matching network were outside the package relatively long lead wires would be required thereby increasing the inductive reactance which must be cancelled by the matching network.

As is also known in the art, a typical microwave transistor package includes a beryllia insulator to provide a low thermal resistance from the transistor die to the package heat sink base or header. The upper and lower surfaces of the beryllia insulator have gold layers for attachment to the transistor die on the upper surface and for attachment to the header on the lower surface. The header also serves as the ground plane conductor. The transistor typically has its collector contact formed on the bottom of the die and hence, in those configurations, requiring a grounded, or common base configuration, it is necessary to electrically connect the base electrode, formed on the upper surface of the transistor die, to the header. This connector is typically done with a wire lead and it is generally desirable to use relatively short leads in order to reduce the inductive reactance of such wire lead since such reactance becomes part of the input impedance to the transistor component. One technique suggested to reduce the length of the lead and hence reduce its parasitic inductive reactance is to position the beryllia between a pair of conductive rails, as discussed in U.S. Pat. No. 3,784,884, issued Jan. 8, 1974, Demir S. Zoroglu, inventor. As discussed in such patent, bonding wires are used to connect the transistor to the grounded rails and the length of such wires is reduced by having the height of the grounded bonding rails approximately equal to the thickness of the beryllia insulator so that the bonding surface of the rail is almost even with the transistor die. However, as described in U.S. Pat. No. 4,150,393, issued Apr. 17, 1979, Richard W. Wilson and Marcy B. Goldstein, inventors, and assigned to the same assignee as U.S. Pat. No. 3,784,884, referred to above, relatively expensive coined bonding rails are required in such package.

One technique suggested to remove the requirement for the coined bonding rails discussed in U.S. Pat. No. 4,784,884, referred to above, is to provide a copper header with a pedestal having a channel formed in the upper surface thereof into which the metallized beryllium insulator is positioned as discussed in U.S. Pat. No. 4,150,393, referred to above. Also included in the package discussed in the latter patent is a toroid shaped alumina ceramic insulator which encircles the sides of the pedestal portion of the header and which has lower surfaces which rest on the lower base portion of the header. The upper surface of the insulator support metallized conductive leads to the package. The alumina insulator, conductive coated beryllia insulator and metal conductive leads are brazed together in one operation to form a single unit. It is first noted, however, that, as mentioned above, in high power devices the impedance matching network should be included within the package and with the relatively small package described above, while patentee suggests that surfaces of the pedestal can be utilized to have a MOS chip capacitor attached to it, if the size of the pedestal were increased to have sufficient surface area to accomodate impedance matching devices the toroid shaped ceramic insulator would tend to splinter during brazing of the ceramic insulator to the header, since mechanical stresses during brazing cause the insulator to splinter because of the great difference between the relatively low coefficient of thermal expansion of the ceramic insulator and the relatively high thermal coefficient of expansion of the copper header. However, the cylindrical form of the package does not allow it to be readily used with more readily available circuitry which is designed to receive rectangular packages. Further, increasing the size of the pedestal header to accomplish the impedance matching devices tends to agravate the effect of the great difference between the thermal expansion properties of the header and the ceramic on the ceramic's tendency to splinter.

SUMMARY OF THE INVENTION

In accordance with the present invention, a microwave transistor package is provided having: a thermal and electrical conductive refractory type substrate; a ground plane plate having an open-ended compartment therein, such open-end being disposed adjacent an upper surface portion of the ground plane plate, a bottom surface of such plate being disposed on an upper, inner surface region of the substrate; the thermal coefficient of expansion of the ground plane plate being substantially greater than the thermal coefficient of expansion of the substrate; an electrical insulator, disposed within the compartment having a relatively high thermal transfer characteristic and having upper and lower conductive layers with side wall portions disposed adjacent side wall portions of the compartment; a first apertured ceramic insulating layer having conductive metallization regions disposed on the upper surface of the ceramic insulator and extending from the apertured edge of the ceramic insulator to the outer edge of the ceramic insulator, the lower surface of the ceramic insulator being disposed over a surface portion of the substrate disposed about peripheral portions of the inner surface region of the substrate; a second apertured ceramic insulating layer disposed over and aligned with the first apertured ceramic insulating layer, the upper surface of the second ceramic insulating layer being metallized and bondable to a cover for such package. The package is fabricated by brazing together, in a single step, the pair of ceramic insulating layers, the electrical insulator (typically beryllia) and the substrate. Thus, since the substrate and the ceramic insulating layers have substantially the same, relatively low thermal coefficients of expansion, the ceramic insulating layers will not crack during the brazing step. Further, while the substrate is of a refractory type material and hence impractical for machining into a channel provided pedestal, the ground plane plate is relatively thin and can be easily provided with a compartment for the beryllia and also be made large enough to accomodate an impedance matching device on the upper surface portion of the ground plane plate adjacent the compartment; the use of the compartment enabling the use of relatively short grounding wire leads from between the upper surface of the ground plane plate and the transistor die mounted to the upper, metallized surface of the beryllia.

BRIEF DESCRIPTION OF THE DRAWINGS

The foregoing features of this invention as well as the invention itself may be more fully understood from the following detailed description read together with the accompanying drawings, in which.

DESCRIPTION OF THE PREFERRED EMBODIMENT

Figure 1:
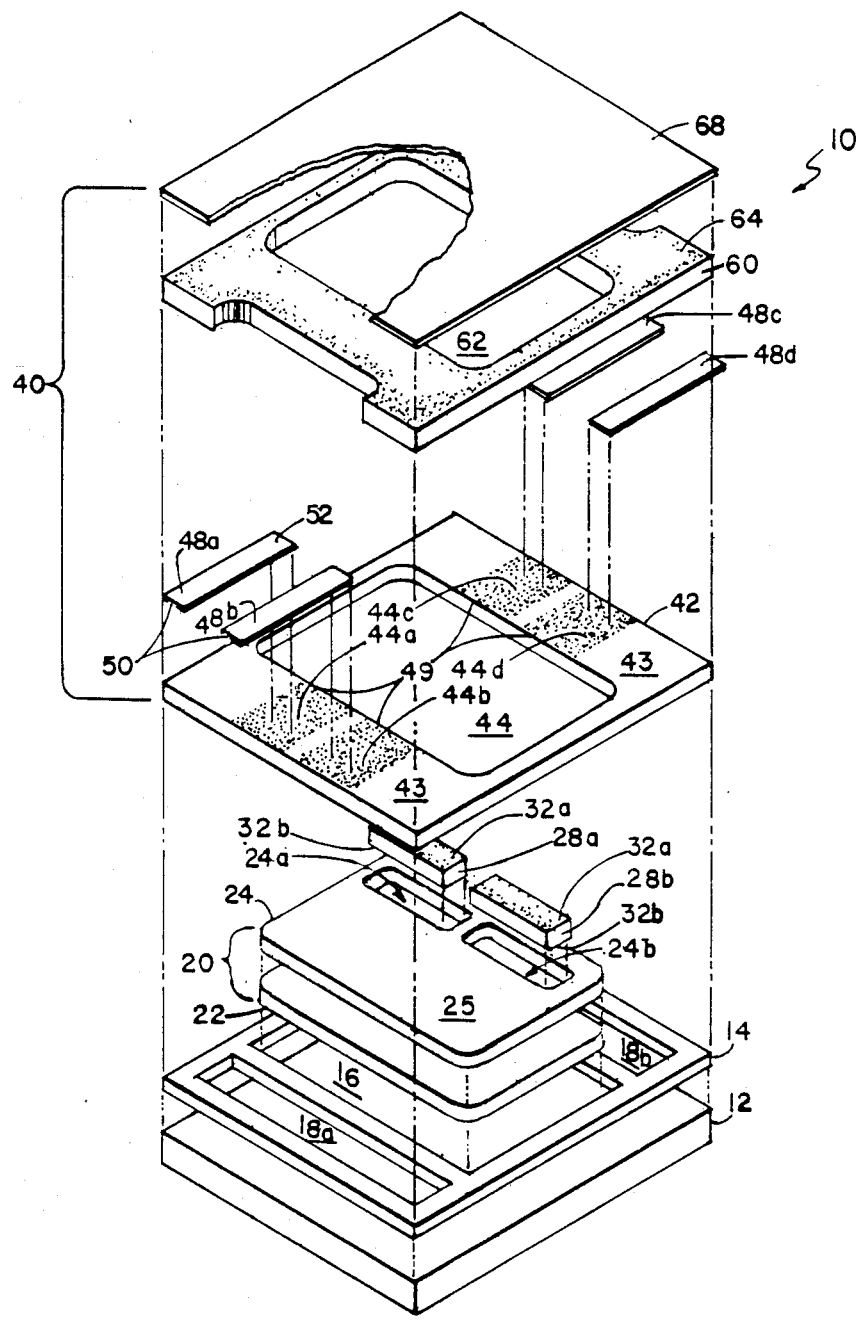
FIG. 1 is an exploded, isometric drawing of a microwave transistor package according to the invention.
Figure 2:
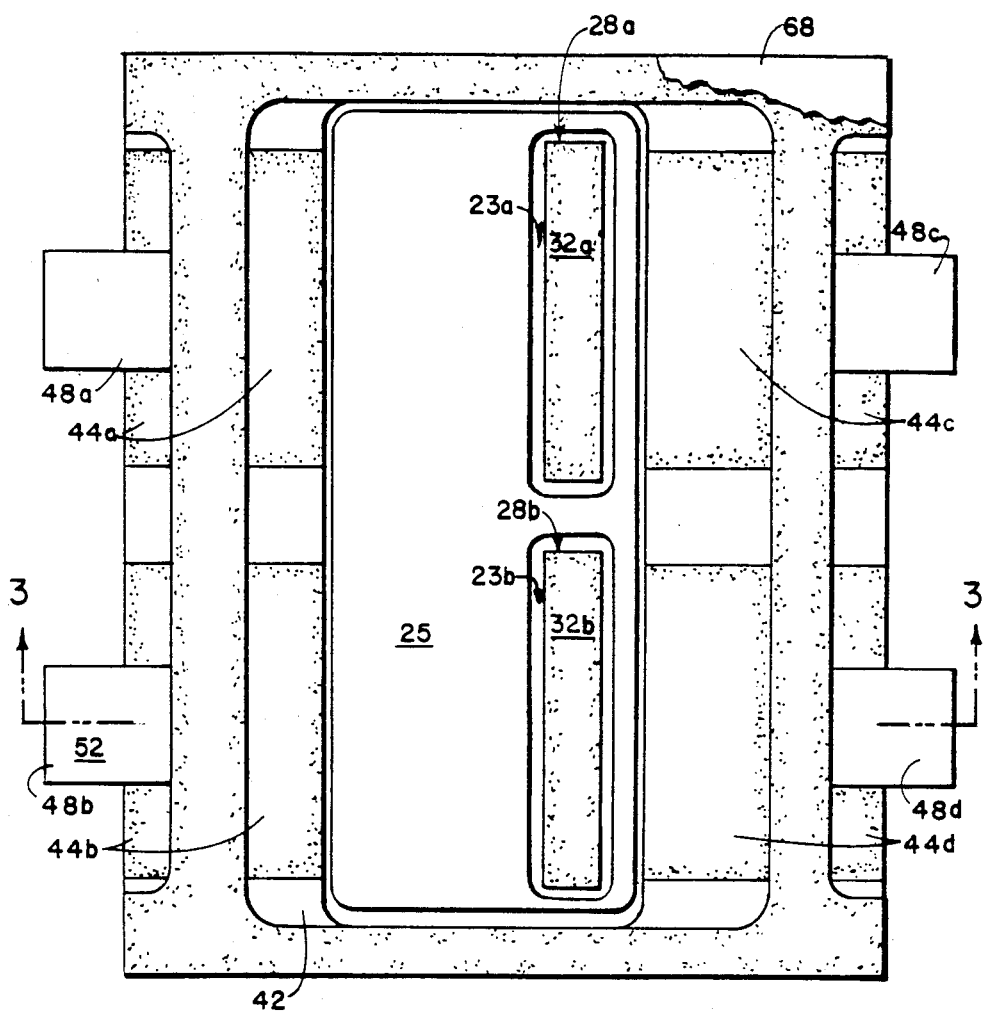
FIG. 2 is a plan view of the microwave transistor package of FIG. 1.
Figure 3:
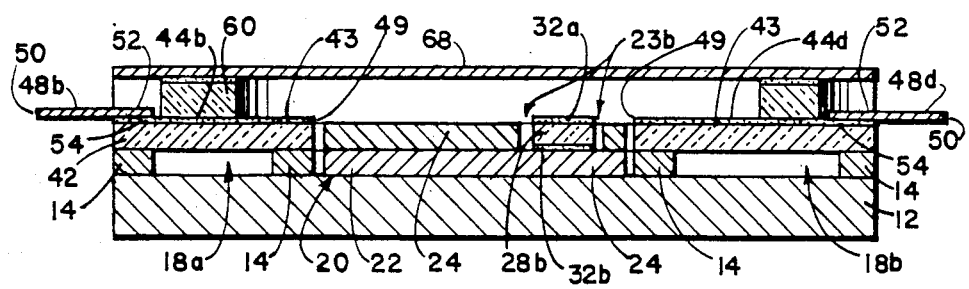
FIG. 3 is a cross-section elevation view of the package of FIG. 1, such cross-section being taken along line 3—3 of FIG. 2.

Referring now to FIGS. 1, 2 and 3, a microwave transistor package 10 is shown to include a rectangular planar, electrically and thermally conductive substrate 12, here an 0.042 inch thick slab of a refractory material, here sintered tungsten infiltrated with copper (here Thermkon material, a product of CMW, Inc., Indianapolis, Ind. having a relatively low thermal coefficient of expansion. The outer dimensions of the substrate 12 are here 0.56 inches by 0.48 inches. Disposed over the substrate 12 is a 0.020 inch thick copper buffer ring 14 having a relatively large aperture 16 flanked by a pair of smaller apertures 18a and 18b. The ring 14 is disposed on, and aligned with, the outer edges of the substrate 12. A relatively thin, here 0.040 inch thick copper ground plane plate 20, is fabricated by constructing a laminated structure made up of a lower copper sheet 22, here 0.020 inches thick, to which is soldered an upper copper sheet 24, here also 0.020 inches thick. The upper sheet 24 has a pair of rectangular apertures 24a, 24b formed therein using conventional photolithographic chemical etching techniques. It is noted that the linear thermal coefficient of expansion of the copper plate 20 (19 microinches per inch per degree centigrade) is substantially greater than the linear thermal coefficient of expansion of the refractory substrate 12 (9.5 micro-inches per inch per degree centigrade). The outer dimensions of the ground plane plate 20 are here 0.225 inches by 0.375 inches and are dimensioned to allow such plate 20 to fit into the larger aperture 16 formed in buffer ring 14. The dimensions of each of the smaller apertures 24a, 24b are here 0.118 inches by 0.048 inches. It is noted that when the upper and lower sheets 22, 24 are soldered together, a pair of rectangularly shaped open-ended compartments 23a, 23b (FIG. 2) are formed with plate 20. Further disposed adjacent the pair of compartments 23a, 23b is a relatively large portion 25 of the upper surface of the ground plane plate 20 and, as will be discussed herein after, such surface portion 25 will be used for mounting impedance matching circuitry components. Completing the lower portion of the package 10 are a pair of electrically insulating bodies 28a, 28b having relatively high thermal transfer conductivity characteristics, here 0.025 inch thick beryllia (BeO) (having a linear thermal coefficient of expansion of 9 micro-inches per inch per degree centigrade) coated on the upper and lower surfaces with molybdenum-manganese-gold conductive layers 32a, 32b, respectively as shown. The bodies 28a, 28b are disposed within the compartments 23a, 23b, respectively. It is noted that since the compartments 23a, 23b are herein 0.020 inches deep, that the upper surfaces of the coated beryllia bodies 28a, 28b are substantially level, or even, with the upper surface of the ground plane plate 20. In this way, as will be described hereinafter, once transistor dies (not shown) are mounted to the layer 32a on the upper conductive coated surface of the bodies 28a, 28b, the electrical contacts of such transistors, more particularly base electrode contacts, thereof, may be electrically connected to ground in a common, or grounded base configuration, through the use of relatively short lead wires which extend from the base contacts to the upper surface region 25 of the ground plane plate 20 adjacent to the edges of the compartments 23a, 23b.

Referring now to the upper portion of the package 10, a laminated apertured, ceramic (here alumina) insulator 40 (FIG. 1) is shown, the aperture exposing the upper surface of the ground plane plate 20, while the frame of the insulator 40 has the lower surface disposed on the portions of the upper surface of peripheral portions of such ring 14. It is noted that the insulator 40 is disposed over the smaller apertures 18a, 18b formed in buffer ring 14, as shown in FIG. 3. The insulator 40 includes a lower alumina apertured layer 42, here about 0.025 inches thick, the peripheral edges being aligned with the peripheral edges of both the substrate 12 and the buffer ring 14. The aperture 44 formed within layer 42 is aligned with, and exposes, the upper surface of ground plane plate 20 while the frame portion of layer 42 is disposed on the portion of ring 14 disposed about the smaller apertures 18a, 18b of the buffer ring 14. Thus, while the larger aperture 16 has disposed within it the lower copper layer 22 of ground plane plate 20, the upper layer 4, has disposed about its periphery the outer edges of the aperture 44 of lower ceramic layer 42. Thus, it is noted that the upper surface of ground plane plate 20 is substantially even, or level with, the upper surface 43 of the lower ceramic layer 42, as shown more clearly in FIG. 3.

Opposing side portions of the upper surface 43 of lower ceramic layer 42 are metallized with a suitable refractory metal, here tungsten by thick-film screening to form four conductive regions 44a, 44b, 44c, 44d (FIG. 1) which are electrically insulated from each other, and which extend longitudinally from the outer edge of the aperture formed on the surface of lower ceramic layer 42 to the outer edges of such layer 42. It is noted that two pairs of opposing conductive regions 44a, 44b, or 44c, 44d are provided with inner ends 49 disposed adjacent the upper surface of the ground plane plate 20, as shown in FIGS. 2 and 3. Connected to the conductive regions 44a-44d are planar gold-plated kovar material strip conductive leads 48a-48d, respectively, as shown, that are brazed to conductive layers 44a-44d. It is noted that while the outer ends 50 of the leads 44a-48d extend beyond the outer periphery of the package 10, the inner ends 52 of the leads 48a-48d are connected to the outer regions 54 of the conductive regions 44a-44d, as shown more clearly in FIG. 3.

The upper ceramic (here alumina) insulating layer 60, here is about 0.050 inches thick, has an aperture 62; it being noted that while this aperture 62 is aligned with the aperture 44 formed in the lower ceramic layer 42, aperture 62 is larger than the aperture in the lower layer 42. Thus, as shown in FIG. 3, it is noted that the lower surface of the upper insulating layer 60 is disposed on the upper surface of the lower ceramic layer 42. It is also noted that portions of the lower surface of upper ceramic layer 60 are disposed on the upper surface portions of the metallized conductive regions 44a-44d. It is noted, however, that the inner ends 52 of the leads 48a-48d are disposed outside of the upper ceramic layer 60, as shown in FIGS. 2 and 3. A conductive layer 64, here a thick-film screened gold-plated tungsten metallization, forms the upper surface of the upper ceramic insulating layer 60, such conductive layer 64 being used for bonding, and thereby hermetically sealing a cover 68 (here either kovar or ceramic alumina) to the package 10 after the transistor devices (not shown) and impedance matching devices (not shown) have been mounted within the package 10.

The package 10 is fabricated by brazing, in a single firing, substrate 12, the ring 14, the laminated ceramic insulator 40, the laminated copper ground plane plate 20 and the pair of conductive coated beryllia bodies 28a, 28b disposed within the compartments 23a, 23b, respectively. A suitable braze material, not shown, (here a copper-silver alloy) seals the ceramic insulator 40 to the substrate 12. It is first noted that the substrate 12 and the alumina ceramic used in the laminated insulator 40 have approximately the same, relatively low, linear thermal coefficients of expansion (the linear thermal coefficient of expansion being 8.5 micro-inches per inch per degree centrigrade) and hence the tendency of cracking or splintering of the alumina is reduced. The copper laminated ground plane plate 20, while having a relatively high thermal coefficient of expansion does expand during the firing; however, it becomes brazed to the substrate 12 and remains brazed to the substrate 12, in its expanded condition, during the subsequent cooling process. The copper used in plate 20 thus, because of its excellent electrical characteristics (i.e., low resistivity) provides a good radio frequency ground adjacent to the transistor die (not shown) to be mounted on the upper conductive coated surface of the beryllia bodies 28a, 28b, and for metal oxide semiconductor (MOS) capacitors (not shown) which are impedance matching devices and which are to be mounted to surface portion 25 of the plate 20. Though the coefficient of thermal expansion of the copper ground plane plate 20 is greater than that of substrate 12, the annealing of the copper that occurs during the braze, firing cycle combined with the low strength of the copper relative to the base results in a copper surface which expands in thermal expansion like the substrate to which it is brazed. This is important to the mounting of the MOS capacitors in that it minimizes the bond stresses which would normally develop between the capacitors and the copper because of the large coefficient of thermal expansion of the copper.

Figure 4:
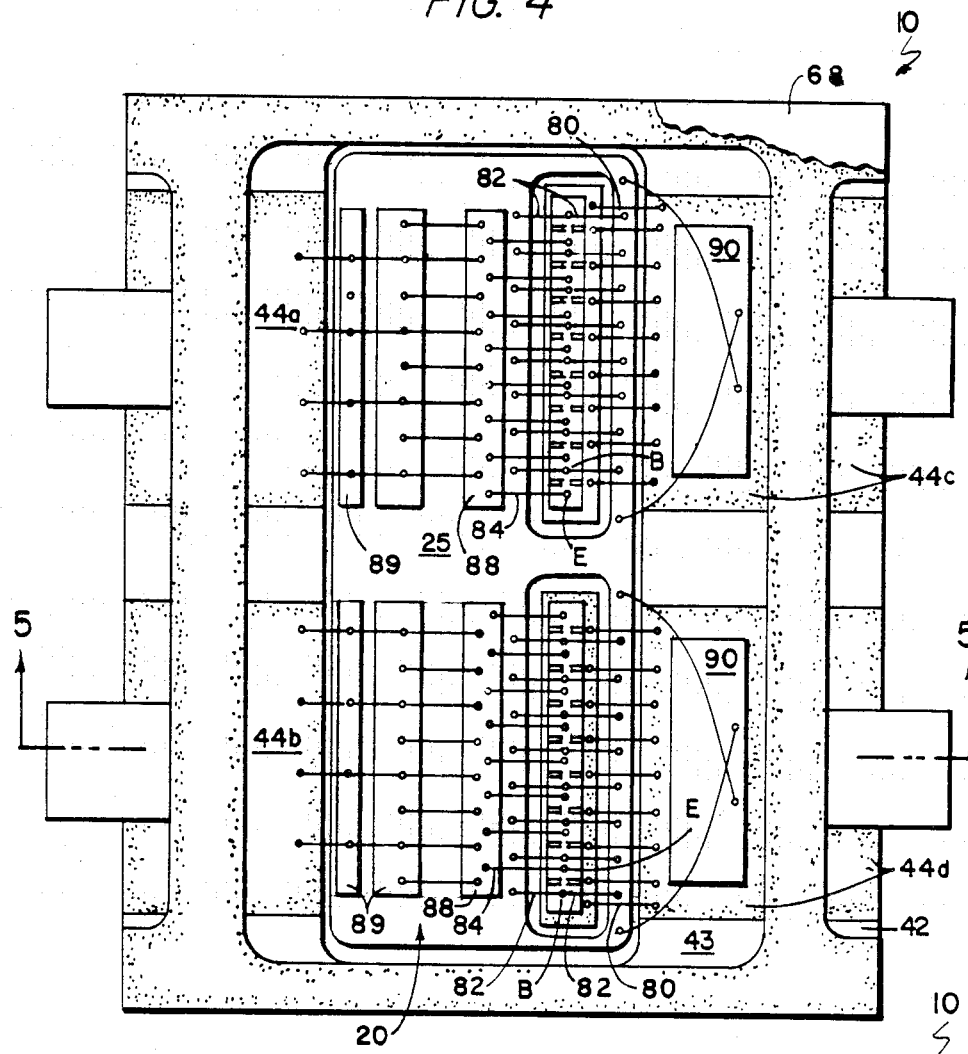
FIG. 4 is a plan view of the microwave transistor package of FIG. 1 having packaged therein a transistor component and electrically interconnected impedance matching devices.
Figure 5:
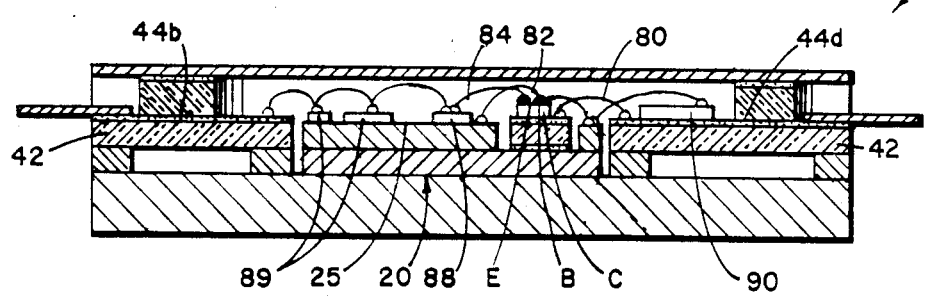
FIG. 5 is a cross-section elevation view of the package shown in FIG. 4, such cross-section being taken along line 5—5 of FIG. 4.

Referring now to FIGS. 4 and 5, the package 10 is shown to have a pair of transistor devices, each one thereof comprising a plurality of parallel connected transistor cells arranged in a grounded, or common base configuration. The conductive bonding wires 80 are used to connect the collector (C) contacts of the transistor (which are electrically connected to the upper metallized surface of the beryllia) to the adjacent upper portion of a pair of the metallized conductive regions 44c, 44d formed on upper surfaces of the lower insulating layer 42 of the ceramic insulator 40 (it being noted that MOS, D-C blocking capacitors 90 are disposed on such regions); also conductive leads 82 are used to connect the base (B) electrodes of the transistor to the adjacent upper surface of the ground plane plate 20; and the bonding wires 84 are used to connect the emitter electrode (E) to the MOS capacitor 88 mounted to region 25 of the ground plane plate 20. The interconnected MOS capacitors 89 are coupled to the metallized conductive regions 44a, 44b formed on the upper surface of the lower insulating layer 42.

Having eutectically attached the electrical components within the package 10, the cover 68 (FIG. 1) is soldered with gold-tin solder to the conductive layer 64 on the upper surface of upper insulator layer 44 to thereby provide a hermetically sealed package 10.

Having described a preferred embodiment of the invention, it is now evident that other embodiments incorporating its concepts will become readily apparent to one of skill in the art. It is felt, therefore, that this invention should not be restricted to the disclosed embodiment but rather should be limited only by the spirit and scope of the appended claims.

What is claimed is:

1. In combination:
   (a) a thermal and electrical conductive substrate;
   (b) a ground plane plate having an open-ended compartment therein, the open-end of such compartment being disposed adjacent an upper surface portion of the plate, a bottom surface of such plate being disposed on, and bonded to, a first upper surface portion of the substrate, the thermal coefficient of expansion of the ground plane plate being substantially greater than the thermal coefficient of expansion of the substrate; and
   (c) an electrical insulator having an aperture therethrough, such insulator having lower surface portions disposed on, and bonded to, a second upper surface portion of the substrate disposed about the first upper surface portion of the substrate, such aperture exposing the open-end of the compartment and the upper surface portion of the plate.

2. The combination recited in claim 1 including a second electrical insulator having relatively high thermal transfer characteristics and having electrical conductive layers on upper and lower surfaces thereof, such second insulator being disposed within the compartment, the upper conductive layer being substantially level with the upper surface portion of the plate.

3. The combination recited in claim 2 including impedance matching electrical components disposed on the upper surface portion of the plate.

4. A microwave transistor package comprising:
(a) a thermal and electrical conductive substrate;
(b) a ground plane plate having an open-ended compartment therein, such open-end being disposed adjacent an upper surface portion of the ground plane plate, a bottom surface of such plate being disposed on an upper, inner surface region of the substrate, the thermal coefficient of expansion of the ground plane plate being substantially greater than the thermal coefficient of expansion of the substrate;
(c) electrical insulator means for supporting a microwave transistor, said electrical insulator means being disposed within the compartment, having a relatively high thermal transfer characteristic and having upper and lower conductive layers with side wall portions disposed adjacent side wall portions of the compartment;
(d) a first apertured ceramic insulating layer having conductive metallization regions disposed on the upper surface of the ceramic insulating layer and extending from adjacent the apertured edge of the ceramic insulator to adjacent the outer edge of the ceramic insulator, the lower surface of the ceramic insulator being disposed over a surface portion of the substrate disposed about peripheral portions of the inner surface region of the substrate; and
(e) a second apertured ceramic insulating layer disposed over and aligned with the first apertured ceramic insulating layer, the upper surface of the second ceramic insulating layer being metallized and bondable to a cover for such package.

5. The package recited in claim 4 including impedance matching electrical components disposed on the upper surface portion of the plate.

* * * * *